United States Patent [19]
Siergiej et al.

[11] Patent Number: 5,705,830
[45] Date of Patent: Jan. 6, 1998

[54] STATIC INDUCTION TRANSISTORS

[75] Inventors: Richard R. Siergiej, Irwin; Anant K. Agarwal, Monroeville; Rowland C. Clarke, Saltsburg; Charles D. Brandt, Mt. Lebanon, all of Pa.

[73] Assignee: Northrop Grumman Corporation, Los Angeles, Calif.

[21] Appl. No.: 708,447

[22] Filed: Sep. 5, 1996

[51] Int. Cl.⁶ ................................................ H01L 31/0312
[52] U.S. Cl. .......................... 257/77; 257/267; 257/284
[58] Field of Search ........................... 257/77, 263, 266, 257/284, 615, 623, 267

[56] References Cited

U.S. PATENT DOCUMENTS

| | | | |
|---|---|---|---|
| 4,199,771 | 4/1980 | Nishizawa et al. | 357/22 |
| 4,375,124 | 3/1983 | Cogan | 29/571 |
| 4,404,575 | 9/1983 | Nishizawa | 357/22 |
| 4,470,059 | 9/1984 | Nishizawa et al. | 357/22 |
| 4,476,622 | 10/1984 | Cogan | 29/571 |
| 4,755,859 | 7/1988 | Suda et al. | 357/23.4 |
| 5,202,273 | 4/1993 | Nakamura | 437/40 |
| 5,216,275 | 6/1993 | Chen | 257/493 |
| 5,382,822 | 1/1995 | Stein | 257/76 |
| 5,391,897 | 2/1995 | Nonaka | 257/136 |
| 5,434,435 | 7/1995 | Baliga | 257/330 |
| 5,434,447 | 7/1995 | Miyashita et al. | 257/514 |

FOREIGN PATENT DOCUMENTS 2071912  9/1981  United Kingdom .................. 257/284

Primary Examiner—Mark V. Prenty
Attorney, Agent, or Firm—Walter G. Sutcliff

[57] ABSTRACT

A static induction transistor includes a substrate and a drift layer with different doping levels. At least two mesas are formed on the drift layer and a heavily doped region is positioned on a top surface of each of the mesas. A gate contact extends along a bottom of a recess between the mesas and along a side of each of the mesas forming the recess. The gate contact also extends along a portion of the top surface of each of the mesas. In one embodiment of the invention, a notch is formed in the top surface of the mesas between the gate contact and the heavily doped region.

19 Claims, 5 Drawing Sheets

5,705,830

STATIC INDUCTION TRANSISTORS

BACKGROUND OF THE INVENTION

This invention relates generally to semiconductor devices, and more particularly, to static induction transistors.

Static induction transistors are field effect semiconductor devices capable of operation at relatively high frequency and power. The transistors are characterized by short, high resistivity semiconductor channel which may be controllably depleted of carriers. Static induction transistors generally use vertical geometry with source and drain electrodes placed on opposite sides of a thin, high resistivity layer of one conductivity type. Gate regions are positioned near the source electrode. During operation, a bias voltage is applied between the gate region and the remainder of the high resistivity layer causing a depletion region to extend into the channel below the source. As the magnitude of the bias is varied, the source-to-drain current and voltage derived from an attached energy source will also vary.

Certain potential applications for static induction transistors, such as in high definition television transmitters, require transistors having improved reliability and improved frequency performance. Other applications, such as in electric power conversion equipment, require power transistors that can operate at voltage levels which are above the operating voltages of current static induction transistor designs.

SUMMARY OF THE INVENTION

Static induction transistors fabricated in accordance with this invention include a substrate layer; a drain contact positioned on one side of the substrate layer; and a drift layer positioned on the other side of the substrate layer. The drift layer is shaped to form multiple mesas, with adjacent mesas defining recesses in the drift layer. Source regions are positioned near top surfaces of the mesas. Source contacts are positioned adjacent to the source regions. A gate contact is positioned in the recesses. The gate contact extends along a bottom surface of the recesses and along the sidewall of each of the mesas which define the recesses.

In one embodiment of the invention, a notch is formed in the top surface of the mesas between the gate contact and the source regions.

This invention provides static induction transistors which achieve improved operating characteristics and can be constructed using well known processing techniques. Other objects and advantages of the invention will become apparent from a description of the preferred embodiments thereof shown in the drawings.

DETAILED DESCRIPTION OF THE PREFERRED EMBODIMENTS

The preferred embodiment of the invention is constructed using silicon carbide as the semiconductor material. Silicon carbide is a wide energy band gap semiconductor (approximately 3 eV), and is thus an attractive material for the fabrication of integrated power circuitry. Silicon carbide offers high saturation electron velocity (approximately $2\times10^7$ cm/s), high junction breakdown voltage (approximately $2\times10^6$ V/cm), high thermal conductivity (approximately 5W/cmK) and broad operating temperature range (around 500° C.). In addition, the energy band gap and thus the maximum operating temperature range of silicon carbide is at least twice that of conventional semiconductors. Static induction transistors constructed in silicon carbide have been proposed in commonly assigned application no. 08/462,405, filed Jun. 5, 1995, now U.S. Pat. No. 5,612,547.

The static induction transistors of this invention which use SiC as the preferred semiconducting material offer improved performance over state of the art static induction transistors. Improved characteristics include (i) higher breakdown voltage due to higher field strength; (ii) lower thermal impedance due to better thermal conductivity; (iii) higher frequency performance due to higher saturated electron velocity; (iv) higher current due to higher field before velocity saturation; (v) higher operating temperature due to larger band gap; and (vi) improved reliability particularly in harsh environments.

While the preferred embodiment of this invention uses silicon carbide material, it should be understood that the invention is not limited to static induction transistors constructed of silicon carbide. In addition to silicon carbide, other semiconductor materials such as gallium arsenide (GaAs), gallium nitride (GAN), indium phosphide (InP) or combinations thereof can be used as the semiconductor material.

Figure 1:
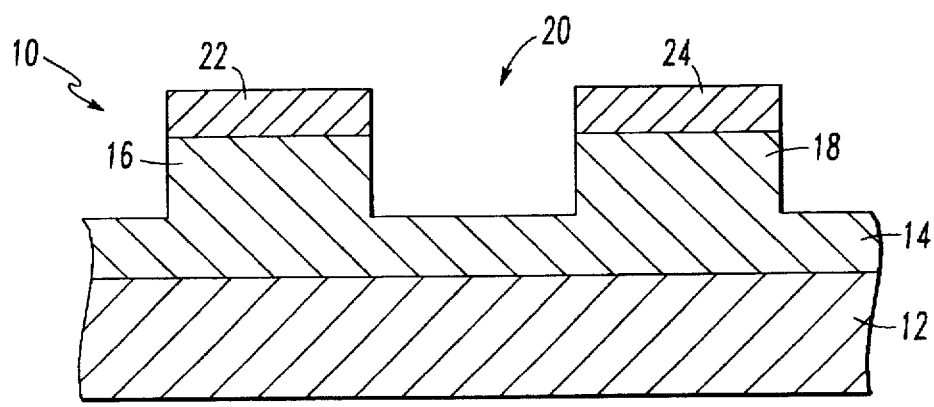
FIGS. 1 through 6 are cross-sectional views of a static induction transistor device being manufactured in accordance with this invention.

FIGS. 1–6 illustrate the salient features of the process used to construct Schottky barrier recessed gate type static induction transistors in accordance with this invention. FIG. 1 shows a cross-section of a fragment of a semiconductor wafer which can be used to make the transistors. A semiconductor body 10 having a relatively heavily doped semiconductor substrate 12 (which may also be called a drain layer) of a first conductivity type (n-type in this example) and a drift layer 14 of the same conductivity type, but with a lower concentration of impurities is preferably grown epitaxially on the substrate. An n+ region is formed, for example by ion implantation, or grown epitaxially on the top of the drift layer. Reactive ion etching can be used to shape the top surface of the drift layer to create a series of thick, spaced apart mesas (or fingers) only two (16 and 18) of which are shown. Adjacent mesas define recesses 20 in the drift layer between the mesas. The reactive ion etching is done by standard means known in the industry, in which a masking material, such as chrome and nickel, is applied in a pattern to those areas in which it is desired that no material be removed. A reactive ion is then applied to the drift layer surface etching away the unmasked portions. The heavily doped (n+) regions 22 and 24 which remain on the tops of the mesas will serve as source regions. Alternatively, the source regions may be created in the mesas after the mesas have been formed. For example, ion implantation may be used to create source wells in the top surfaces of the mesas.

The designations of "+" and "−" used with the conductivity type are understood in the industry to indicate heavy and light doping, respectively. With reference to the present preferred embodiments of the invention, light doping (n− or p−) will generally indicate a range of roughly $10^{15}$–$10^{16}$ dopants/cm$^3$. Heavy doping (n+ or p+) will generally indicate $9 \times 10^{18}$ dopants/cm$^3$ or greater.

Figure 2:
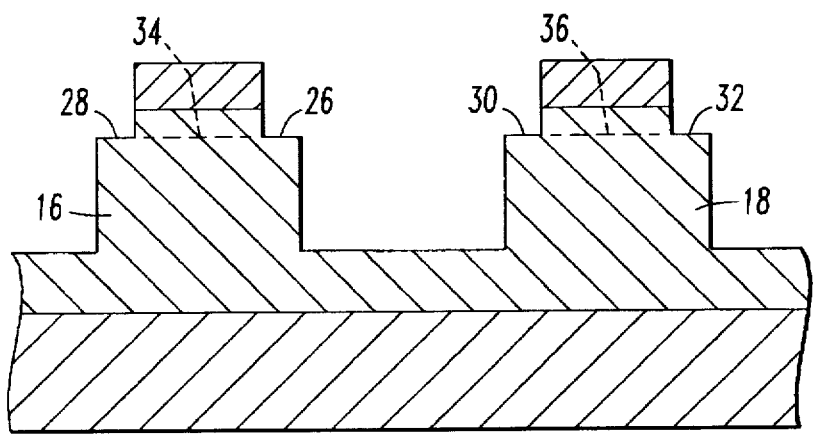

FIG. 2 shows the structure after the size of the heavily doped source regions has been reduced so that they extend over just a central portion of the tops of the mesas. This process forms shoulders 26, 28, 30 and 32 on the top surfaces 34 and 36 of the mesas. This reduction in the size of the heavily doped source regions may be accomplished by reactive ion etching. For the purposes of this description, the top surfaces of the mesas are considered to be planes containing the shoulders of the mesas. In the preferred embodiment of the invention, the mesas can have a height of 0.4 to 2.0 µm and a width of 0.5 to 4.0 µm. The ratio of the width of the source regions to the width of the mesas can range from 0.5 to 0.9. The height of the material which extends upwardly from the shoulders of the mesas and contains the source regions can range from 0.2 to 0.5 µm. The distance from the source regions to the shoulders of the mesas should be keep as small as possible, and may in practice range from 0.0 to 0.2 µm, with 0.05 µm being a typical size. The thickness of the drift layer at the bottom of the recess can range from 1.0 to 10.0 µm. Alternatively, implated n+ wells may be defined in the mesas 16 and 18 in which case a reduction in the size of the heavily doped source region would not be required.

Figure 3:
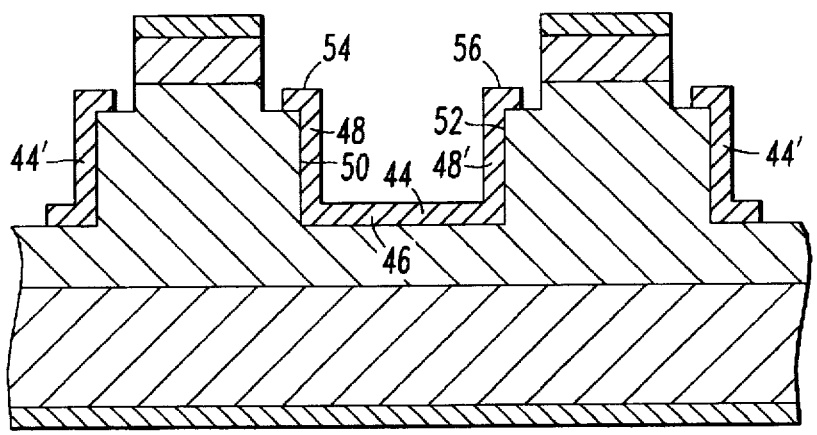

FIG. 3 illustrates another step in which ohmic source contacts 38 and 40 and ohmic drain contact 42 have been formed on the structure. These contacts, which in the preferred embodiment are comprised of nickel, are formed by rapid thermal annealing. While the preferred embodiment uses nickel for the source contacts, it should be understood that these contacts are ohmic contacts which may be formed of other well known contact materials such as Ti, Ti-W, Co, and Al.

Figure 4:
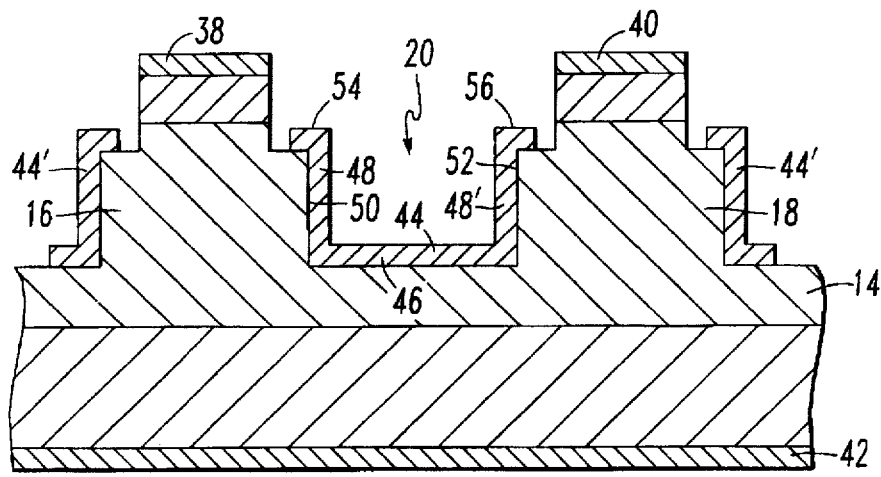

FIG. 4 illustrates the addition of a Schottky gate material 44 which forms part of the gate contact. Additional gate material 44' lies on the outside of the mesas. The gate material 44 may conformally coat the surface of the drift layer 14 in the recess 20 so as to smooth out and flatten that surface. The deposited gate material 44 is preferably platinum although other conductive materials such as molybdenum, gold, nickel, polysilicon and amorphous silicon may also be used. A layer of gate material 44 is provided upon the drift layer 14 within each recess 20. The gate material in each recess has a horizontal section 46 extending along the bottom of the recess and two vertical sections 48 and 48' extending along the sidewalls of the mesas 16 and 18.

Portions of the gate material 44, particularly at the interface of the gate material 44 and the drift layer 14, form a silicide. The silicide is formed by heating the semiconductor and the gate material 44 to a temperature of about 450° C. As the preferred gate material 44 is platinum, the heat treatment will result in the formation of platinum silicide. The preferred material for the ohmic source contacts 38 and 40 is Nickel, however, Ti, Ti-W, Co, and Al are materials which may also be used. The preferred material for the ohmic drain contacts 42 is Nickel, however, Ti, Ti-W, Co, and Al may be used as well. The gate material 44 is shown to extend along the bottom of recess 20 and along the sidewalls 50 and 52 of mesas 16 and 18. In addition, the gate material 44 may optionally further include additional sections 54 and 56 which extend along portions of the shoulders of mesas 16 and 18. The edge of the gate material should be spaced at least 0.1 µm from the source regions.

Figure 5:
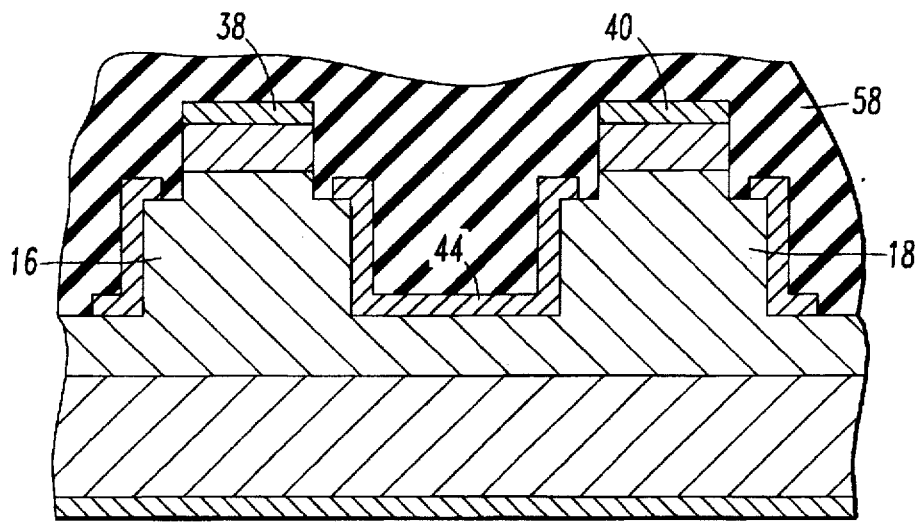

FIG. 5 illustrates a step in which the structure is encapsulated in a suitable dielectric material 58. The dielectric 58, which is preferably sputtered or LPCVD silicon dioxide, but may either be an oxide or a nitride, is then provided over the entire upper portion of the structure as shown in FIG. 5. Thus, the gate material 44, the source contacts 38 and 40 and the exposed portion of the fingers 16 and 18 are all encapsulated by dielectric 58.

Figure 6:
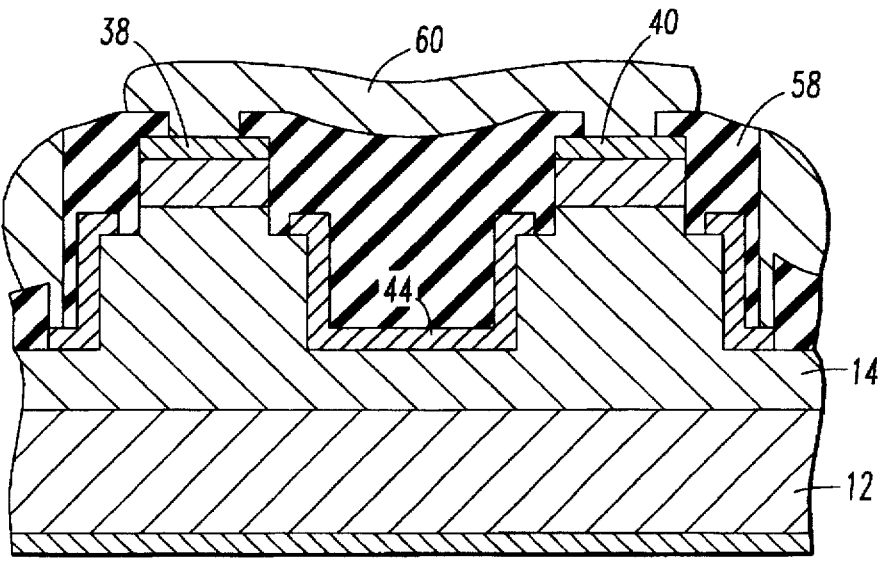

FIG. 6 shows the structure after a metal liftoff process has been used to form metal source interconnect 60 which is used to electrically connect source contacts 38 and 40 to an external circuit. Once the dielectric 58 has been removed so as to expose the gate and each source, a photoresist (not shown) is provided over the entire upper portion of the structure. The photoresist is then patterned so as to remove the photo resist from every area in which metal material, which will comprise electrodes for the transistor, is to remain. Photo resist is therefore not applied to the exposed portions of the source contacts 38 and 40 and gate material 44.

Although it is preferred to form a silicide by heat treating the gate material 44, the device will function without such silicide formation. Also, for each of the embodiments of the static induction transistor provided herein, it is preferred to provide ohmic contacts upon the source and drain regions. A metal source interconnect provides a connection point to an external circuit. However, it will be apparent to those skilled in the art that direct contact with the source and/or the drain regions may also be used. Although it is preferred that the drift layer 14 is epitaxially grown upon the substrate 12, the drift layer 14 and substrate 12 may be provided as a single layer in which various ion implantation provides the desired conductivity types. Similarly, although it is preferred that the source regions 22 and 24 are grown as separate epitaxial layers on the fingers 16 of the drift layer 14, the source regions 22 and 24 may be formed by ion implantation as well.

The substrate 12 and the source regions are preferably n+ conductivity type, 4H polytype single crystal silicon carbide, while the drift layer 14 is preferably n− conductivity type, 4H polytype single crystal silicon carbide. Although 4H polytype silicon carbide is preferred, any polytype may be utilized. Alternating, the substrate and source regions are p+ conductivity type, 4H polytype single crystal silicon carbide while the drift layer is p− conductivity type, 4H polytype, single crystal silicon carbide.

Figure 7:
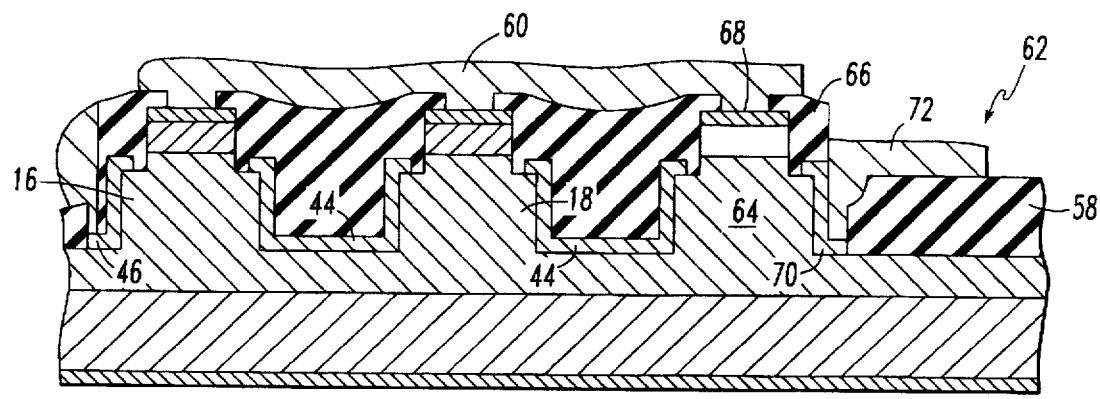
FIG. 7 is a cross-sectional view of a static induction transistor manufactured in accordance with this invention.
Figure 8:
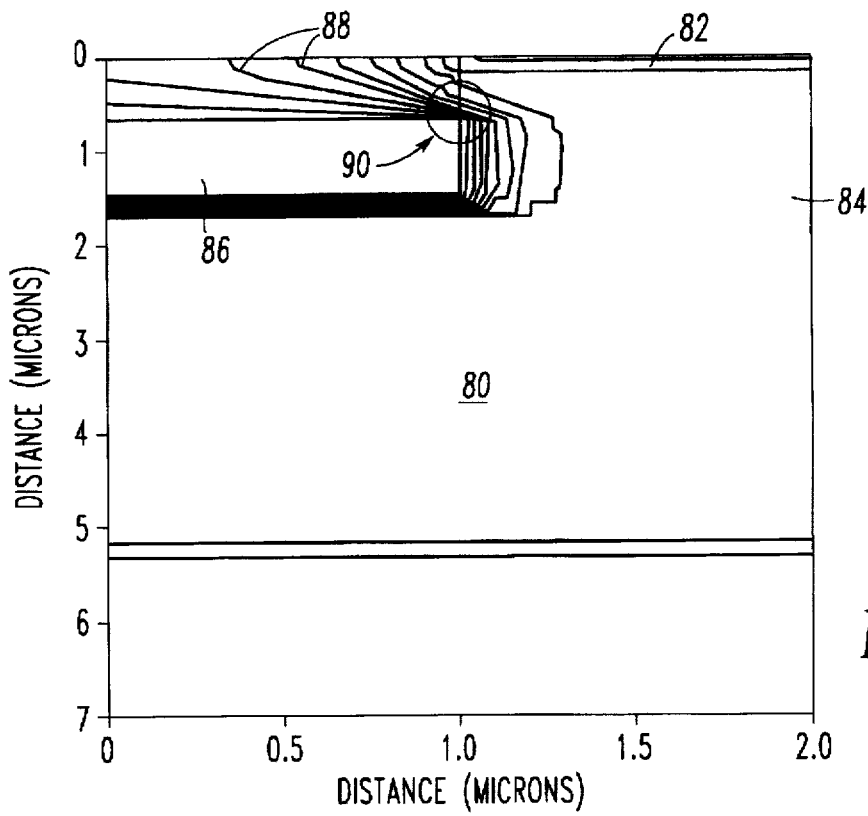
FIG. 8 is a schematic representation of a portion of the gate and source regions of a prior art static induction transistor.

FIG. 7 is a section of a portion of a static induction transistor 62 constructed in accordance with this invention. This figure shows an additional mesa 64 which is constructed to be similar to mesas 16 and 18, and includes a heavily doped source region 66 and source contact 68. Additional gate material 70 is also shown. Metal source interconnect 60' is shown to make electrical contact with the ohmic source contacts on each of the mesas. A gate pad 72 is used to connect the gate material 44, and 70 to an external circuit. The gate pad 72 rests on a portion of dielectric 58. Additional dielectric may be used to minimize capacitive gate losses FIG. 8 is a schematic representation of a portion of the gate and source regions of a prior art static induction transistor 80 in which the source contact 82 extends along the entire surface of the mesa 84. The gate contact 86 is positioned near the bottom of the mesa 84. Lines 88 illustrate equipotential electric field lines generated in a finite element modeling program for this structure. An inspection of lines 88 reveals that a relatively high electric field gradient exists at region 90. This can limit the maximum gate-to-source voltage applied by an external circuit.

Figure 9:
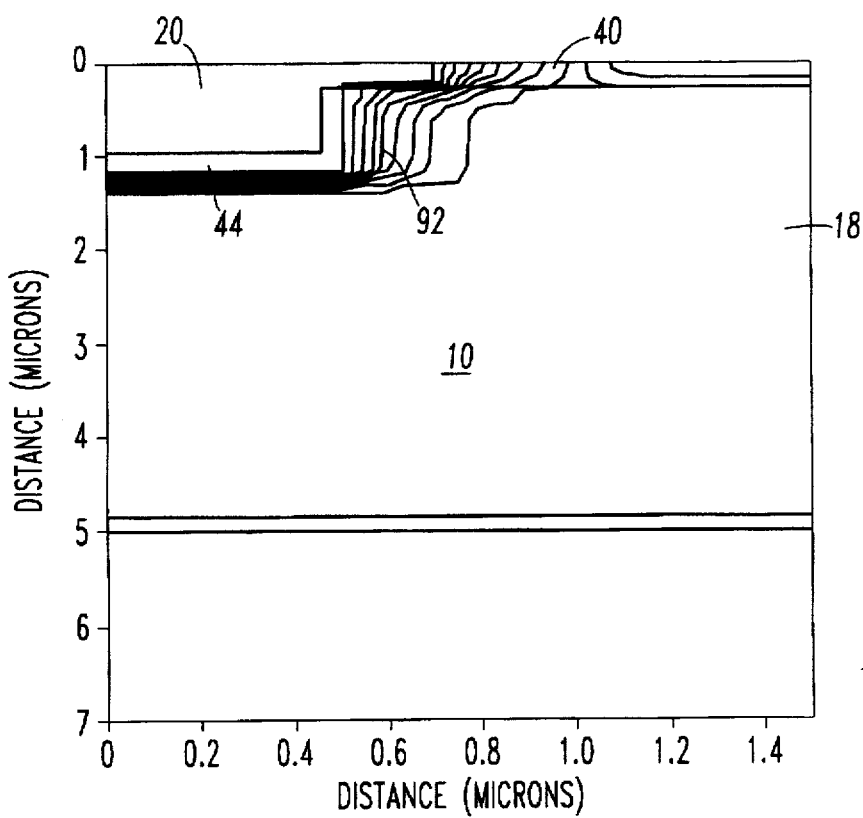
FIG. 9 is a schematic representation of a portion of the gate and source regions of the static induction transistor of FIG. 7.

FIG. 9 is a schematic representation of a portion of the gate and source regions of a static induction transistor 10 constructed in accordance with this invention, in which the gate contact 44 extends along the bottom of recess 20 and along a sidewall of the mesa 18. Lines 92 illustrate equipotential electric field lines generated in a finite element modeling program for this structure. An inspection of lines 92 reveals the absence of a relatively high electric field gradient. This means that voltage is distributed more evenly in the vicinity of the gate electrode improving reliability of the gate contact.

Figure 10:
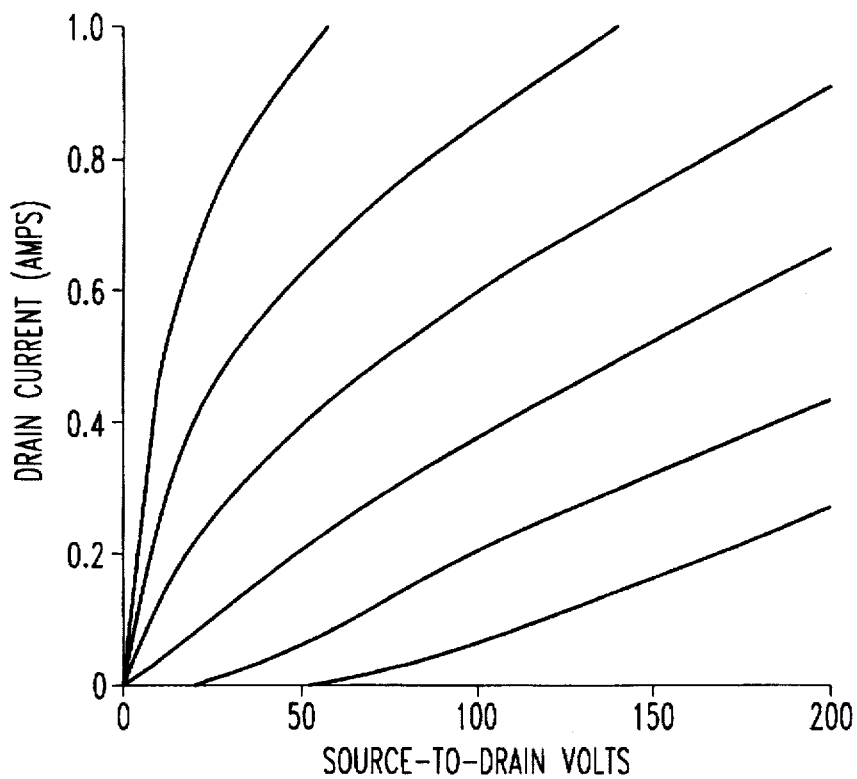
FIG. 10 is a plot of drain current vs. drain-to-source voltage for the structure modelled in FIG. 8.
Figure 11:
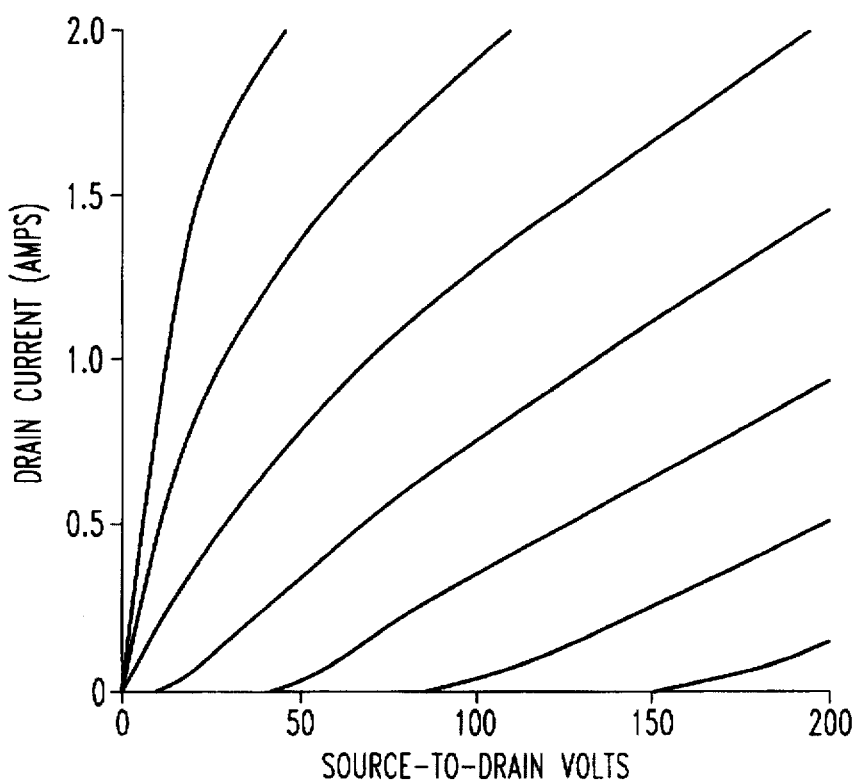
FIG. 11 is plot of drain current vs. drain-to-source voltage for the structure modelled in FIG. 9.

FIGS. 10 and 11 are plots of drain current vs. drain-to-source voltage for the structures modelled in FIGS. 8 and 9 respectively. From these Figures, it is apparent that maximum current, voltage gain, and transconductance are improved for the transistor constructed in accordance with this invention.

Figure 12:
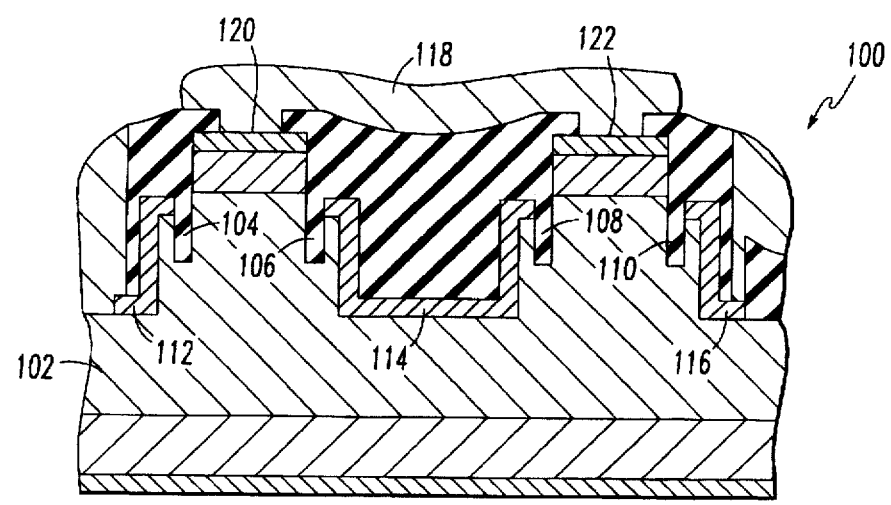
FIG. 12 is a cross-sectional view of an alternative embodiment of a static induction transistor manufactured in accordance with this invention.

FIG. 12 is a cross-sectional view of an alternative embodiment 100 of the invention designed for applications requiring relatively high voltage, high power operation. This embodiment, when constructed in silicon carbide, is particularly suitable for low frequency (<100 kHz) power conditioning circuits, such as drivers for motor actuators on aircraft engines, electric vehicle motor controllers, and other applications in a high temperature environment or where cooling systems must be kept to a minimum.

Two features of the embodiment of FIG. 12 are a drift region 102 that is two to three times thicker than the drift region found in typical static induction transistors, and notches (sometimes referred to as a trenches or recesses) 104, 106, 108 and 110 are positioned around the perimeter of gate material 112, 114 and 116 to reduce field crowding and prevent premature surface breakdown. A metallic source interconnect 118 connects the ohmic source contacts 120 and 122. The drift region thickness in the preferred embodiment is approximately 10 μm, which maintains an electric field in the semiconductor below its destructive breakdown value. This allows voltages as high as 800 volts to be applied between the source and drain terminals. The recessing improves the gate to source breakdown voltage by increasing the lateral extent of the depletion edge. This in turn causes field lines to spread out laterally at the surface, reducing field crowding which would cause surface breakdown.

This invention provides an improved design for static induction transistors which can be fabricated with fewer processing steps than used to fabricate prior art static induction transistors. Gate height is defined by a well controlled reactive ion etching processes. Smaller gate to drain capacitance and footprint are made possible by reducing the gate pitch. Approximately 3 dB additional small signal gain has been shown in modelling results. Improved reliability and higher volume production are inherent in the simplified fabrication process.

The above preferred embodiments of the static induction transistor are recessed Schottky barrier gate types. The drain layer is preferably n+ conductivity type while the drift layer is preferably n− conductivity type and the source regions are preferably n+ conductivity type. However, in an alternative embodiment, the drain layer may be p+ conductivity type while the drift layer is p− conductivity type and the source regions are p+ conductivity type. The drift layer and each source region are preferably formed by epitaxial growth, however, either or both of the layer and the regions may alternatively be formed by ion implantation. The gate material is preferably platinum silicide although any suitable material may be used such as platinum, gold, molybdenum, nickel, and polysilicon. A Schottky barrier gate type design is preferred due to the Schottky barrier construction offering better high frequency performance. Other features such as field plates and implanted guard rings can also be incorporated for improved high voltage operation.

It is known to those skilled in the art that silicon carbide may be crystallized in a great many polytypes, and although the present static induction transistor is preferably formed of a single crystal of 4H polytype, it is understood that the static induction transistor may be formed of any silicon carbide polytype such as 3C, 2H, 6H and 15R.

When compared to silicon, silicon carbide exhibits a doubling of the saturated electron velocity, a factor of four improvement in breakdown field strength, and a factor of three improvement in thermal conductivity. Silicon carbide static induction transistor performance improvements over devices made in silicon include larger breakdown voltage, larger channel current, and larger permissible power density. Silicon carbide static induction transistors constructed in accordance with this invention can achieve a significantly higher power density when operated at microwave frequencies as compared to silicon microwave transistors. Such devices are particularly applicable to high definition television transmitters and surveillance radar systems operating from UHF to S-band. Because silicon carbide is more chemically inert than silicon, and since it can operate at higher temperatures than silicon because of its larger bandgap, devices made with silicon carbide will be more reliable in harsh environments, such as high temperature, chemically corrosive, and radioactive environments.

This invention provides static induction transistors that are more reliable and more easily manufactured than previous static induction transistors. In addition, better frequency performance has been achieved. In embodiments of this device which contain a trench in the mesas between the source contacts and the gate contact, high voltage (800 volt) and high current density (1000 amp/cm$^2$) operation has been demonstrated. Such static induction transistors are suitable for a variety of low frequency power applications.

While certain present preferred embodiments have been shown and described, it should be understood that the invention is not limited thereto but may be otherwise embodied within the scope of the following claims.

What is claimed is:

1. A static induction transistor comprising:

a substrate layer;

a drain contact positioned on a first side of the substrate layer;

a drift layer positioned on a second side of the substrate layer;

the drift layer having at least first and second mesas, each said mesa having a central portion on the top thereof and a shoulder portion on either side of said central portion;

said mesas each having a sidewall defining a recess in the drift layer between adjacent ones of said mesas;

each said mesa including a source region positioned at said central portion of said mesa;

a source contact, contacting said source region of each said mesa;

a gate contact positioned in the recess, the gate contact having a first section extending along a bottom surface of the recess and having second and third sections extending along the sidewalls of the mesas and also along respective said shoulder portions of adjacent ones of said mesas;

said gate contact being in direct contact with said bottom surface, sidewalls and shoulder portions, without the intervention of an oxide layer, to form a Schottky gate contact.

2. A static induction transistor as recited in claim 1, further comprising:

first and second trenches in the top surface of the first mesa, the first and second trenches being positioned on either side of said central portion of the first mesa; and first and second trench in the top surface of the second mesa, the first and second trenches being positioned on either side of said central portion of the second mesa.

3. The static induction transistor of claim 1, wherein:

the first portions of the top surfaces of the mesas are located near the center of the top surfaces of the mesas.

4. The static induction transistor of claim 1, wherein:

the substrate layer is an n+ doped semiconductor;

the drift layer is an n– doped semiconductor; and the first and second source regions are n+ doped semiconductors.

5. The static induction transistor of claim 1, wherein:

the substrate layer, drift layer and source regions are constructed in silicon carbide.

6. A static induction transistor as recited in claim 6, wherein the silicon carbide comprises one of 3C, 2H, 4H, 6H and 15R polytypes.

7. The static induction transistor of claim 1, wherein:

the drain contact, the source contacts and the gate contact are constructed of nickel.

8. The static induction transistor of claim 1, wherein:

the substrate layer comprises gallium nitride.

9. A static induction transistor as recited in claim 1, wherein the drift layer has a thickness of at least 10 μm.

10. A static induction transistor as recited in claim 1, wherein:

the substrate layer, drift layer and source regions are constructed in gallium arsenide.

11. A recessed Schottky gate type static induction transistor comprising:

a substrate fabricated of a heavily-doped silicon carbide having a selected conductivity type;

a drift layer fabricated of a lightly-doped silicon carbide having the selected conductivity type provided upon the substrate, the drift layer having a plurality of spaced-apart mesas which extend outwardly from the drift layer and define recesses therebetween;

a plurality of source regions constructed of heavily doped silicon carbide having the selective conductivity type, each source region being disposed adjacent to a central portion of a top surface of a respective mesa of the drift layer and defining shoulders on either side of said source regions;

a gate material provided on the drift layer between two adjacent mesas, the gate material further lying adjacent to sidewalls of the mesas forming at least one of the recesses and extending along a portion of said shoulders and being in direct contact with said drift layer at the bottom of said recess, along said sidewalls and along said portion of said shoulders, without the intervention of an oxide layer.

12. A static induction transistor as recited in claim 11, further comprising:

first and second trenches in the top surface of each of said mesas, the first trench being positioned on one side of said central portion of said mesa; and the second trench being positioned on the other side of said central portion of said mesa.

13. The static induction transistor of claim 11, wherein:

the substrate layer is an n+ doped semiconductor;

the drift layer is an n– doped semiconductor; and the first and second source regions are n+ doped semiconductors.

14. A static induction transistor as recited in claim 11, wherein the silicon carbide comprises one of 3C, 2H, 4H, 6H and 15R polytypes.

15. The static induction transistor of claim 11, wherein:

the drain contact, the source contacts and the gate contact are constructed of nickel.

16. A static induction transistor as recited in claim 11, wherein the drift layer has a thickness of at least 10 μm.

17. The static induction transistor of claim 1 wherein:

the substrate layer is a p+ doped semiconductor; the drift layer is a p– doped semiconductor; and the first and second source regions are p+ doped semiconductors.

18. The static induction transistor of claim 1 wherein the drift layer and source regions are comprised of gallium nitride.

19. The static induction transistor of claim 1 wherein the gate is comprised of a material selected from the group consisting of molybdenum, gold, nickel, polysilicon or amorphous silicon.

* * * * *